US009431565B2

(12) United States Patent
Lei et al.

(10) Patent No.: US 9,431,565 B2
(45) Date of Patent: Aug. 30, 2016

(54) CHARGE COUPLED DEVICE BASED ON ATOMICALLY LAYERED VAN DER WAALS SOLID STATE FILM FOR OPTO-ELECTRONIC MEMORY AND IMAGE CAPTURE

(71) Applicants: Sidong Lei, Houston, TX (US); Liehui Ge, Houston, TX (US); Antony George, Houston, TX (US); Bo Li, Houston, TX (US); Robert Vajtai, Houston, TX (US); Pulickel M. Ajayan, Houston, TX (US)

(72) Inventors: Sidong Lei, Houston, TX (US); Liehui Ge, Houston, TX (US); Antony George, Houston, TX (US); Bo Li, Houston, TX (US); Robert Vajtai, Houston, TX (US); Pulickel M. Ajayan, Houston, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 16 days.

(21) Appl. No.: 14/522,215

(22) Filed: Oct. 23, 2014

(65) Prior Publication Data

US 2016/0118527 A1    Apr. 28, 2016

(51) Int. Cl.
| | |
|---|---|
| *H01L 21/00* | (2006.01) |
| *H01L 31/113* | (2006.01) |
| *H01L 31/0224* | (2006.01) |
| *H01L 31/18* | (2006.01) |
| *H01L 31/0352* | (2006.01) |

(52) U.S. Cl.
CPC ... *H01L 31/1136* (2013.01); *H01L 31/022408* (2013.01); *H01L 31/035281* (2013.01); *H01L 31/18* (2013.01)

(58) Field of Classification Search
CPC ... B82Y 10/00; H01L 29/04; H01L 29/0665; H01L 29/78681; H01L 29/78696; H01L 29/78648; H01L 29/0673; H01L 27/1292; H01L 27/14603; H01L 27/14625; H01L 27/14632; H01L 27/14638; H01L 27/14687; H01L 31/0224; H01L 31/022475; H01L 31/0324; H01L 31/113; H01L 31/18; H01L 31/0352; H01L 31/1136; H01L 31/022408
See application file for complete search history.

(56) References Cited

U.S. PATENT DOCUMENTS

| | | | |
|---|---|---|---|
| 2001/0023024 A1* | 9/2001 | Aksay | B82Y 30/00 428/425.5 |
| 2004/0080011 A1* | 4/2004 | Starikov | H01L 31/108 257/481 |
| 2006/0071205 A1* | 4/2006 | Nauka | B82Y 10/00 257/20 |
| 2013/0329091 A1* | 12/2013 | Sato | H04N 5/217 348/240.99 |
| 2014/0087191 A1* | 3/2014 | Chua | H01L 21/2007 428/408 |

OTHER PUBLICATIONS

Novoselov, K. S.; Geim, A. K.; Morozov, S. V.; Jiang, D.; Zhang, Y.; et al., Electric Field Effect in Atomically Thin Carbon Films, Science 2004, 306, 666-669.

(Continued)

*Primary Examiner* — Charles Garber
*Assistant Examiner* — Abulfattah Mustapha
(74) *Attorney, Agent, or Firm* — Winstead PC

(57) ABSTRACT

An opto-electronic sensor may provide one or more layers of atomically layered photo-sensitive materials. The sensor may include a gate electrode layer, a dielectric layer in contact with the gate electrode layer, and a working media layer that is photo-sensitive deposited on the dielectric layer. The working media layer may provide one or more layers of one or more materials where each of the one or more layers is an atomic layer. The sensor may also include side electrodes in contact with the working media layer.

20 Claims, 4 Drawing Sheets

(56) References Cited

OTHER PUBLICATIONS

Liu, Y. Q.; Wang, F. X.; Xiao, Y.; Peng, H. D.; Zhong, H. J.; et al., Facile Microwave-Assisted Synthesis of Klockmannite CuSe Nanosheets and Their Exceptional Electrical Properties, *Scientific reports* 2014, 4, 5998.

Lei, S.; Ge, L.; Liu, Z.; Najmaei, S.; Shi, G.; et al., Synthesis and Photoresponse of Large GaSe Atomic Layers, *Nano Lett.* 2013, 13, 2777-2781.

Lei, S.; Ge, L.; Najmaei, S.; George, A.; Kappera, R.; et al., Evolution of the Electronic Band Structure and Efficient Photo-Detection in Atomic Layers of InSe, ACS Nano 2014, 8, 1263-1272.

Radisavljevic, B.; Radenovic, A.; Brivio, J.; Giacometti, V.; Kis, A., Single-layer MoS2 transistors, *Nature Nanotech.* 2011, 6, 147-150.

Jacobs-Gedrim, R. B.; Shanmugam, M.; Jain, N.; Durcan, C. A.; Murphy, M. T.; et al., Extraordinary Photoresponse in Two-Dimensional In2Se3 Nanosheets, *ACS nano* 2014, 8, 514-521.

Li, L.; Yu, Y.; Ye, G. J.; Ge, Q.; Ou, X.; et al., Black phosphorus field-effect transistors, *Nature Nanotech.* 2014, 9, 372-377.

Ci, L.; Song, L.; Jin, C.; Jariwala, D.; Wu, D.; et al., Atomic layers of hybridized boron nitride and graphene domains, *Nature Mater.* 2010, 9, 430-435.

Das, S.; Chen, H. Y.; Penumatcha, A. V.; Appenzeller, J., High Performance Multilayer MoS2 Transistors with Scandium Contacts, *Nano Lett.* 2013, 13, 100-105.

Zhang, B. Y.; Liu, T.; Meng, B.; Li, X.; Liang, G.; et al., Broadband high photoresponse from pure monolayer graphene photodetector, *Nature Commun.* 2013, 4, 1811.

Hu, P.; Wen, Z.; Wang, L.; Tan, P.; Xiao, K., Synthesis of Few-Layer GaSe Nanosheets for High Performance Photodetectors, *ACS Nano* 2012, 6, 5988-5994.

Zhang, W.; Chiu, M. H.; Chen, C. H.; Chen, W.; Li, L. J.; et al., Role of Metal Contacts in High-Performance Phototransistors Based on WSe2 Monolayers, *ACS Nano* 2014, 8, 8653-8661.

Pospischil, A.; Furchi, M. M.; Mueller, T., Solar-energy conversion and light emission in an atomic monolayer p-n diode, *Nature Nanotech.* 2014, 9, 257-261.

Fontana, M.; Deppe, T.; Boyd, A. K.; Rinzan, M.; Liu, A. Y.; et al., Electron-hole transport and photovoltaic effect in gated MoS2 Schottky junctions, *Sci. Rep.* 2013, 3, 1634.

Wi, S.; Kim, H.; Chen, M.; Nam, H.; Guo, L. J.; et al., Enhancement of Photovoltaic Response in Multilayer MoS2 Induced by Plasma Doping, *ACS Nano* 2014, 8, 5270-5281.

Bertolazzi, S.; Krasnozhon, D.; Kis, A., Nonvolatile Memory Cells Based on MoS2/Graphene Heterostructures, *ACS Nano* 2013, 7, 3246-3252.

Liu, J.; Zeng, Z.; Cao, X.; Lu, G.; Wang, L. H.; et al., Preparation of MoS2-Polyvinylpyrrolidone Nanocomposites for Flexible Nonvolatile Rewritable Memory Devices with Reduced Graphene Oxide Electrodes, *Small* 2012, 3517-3522.

Lee, H. S.; Min, S. W.; Park, M. K.; Lee, Y. T.; Jean, P. J.; et al., MoS2 Nanosheets for Top-Gate Nonvolatile Memory Transistor Channel, *Small* 2012, 8, 3111-3115.

Roy, K.; Padmanabhan, M.; Goswami, S.; Sai, T. P.; Ramalingam, G.; et al., Graphene-MoS2 hybrid structures for multifunctional photoresponsive memory devices, *Nature nanotechnology* 2013, 8, 826-830.

Tamalampudi, S. R.; Lu, Y. Y.; Kumar, U. R.; Sankar, R.; Liao, C. D.; et al., High Performance and Bendable Few-Layered InSe Photodetectors with Broad Spectral Response, *Nano Lett.* 2014, 14, 2800-2806.

Pu, J.; Yomogida, Y.; Liu, K. K.; Li, L. J.; Iwasa, Y.; et al., Highly Flexible MoS2 Thin-Film Transistors with Ion Gel Dielectrics, *Nano Lett.* 2012, 12, 4013-4017.

Lee, G. H.; Yu, Y. J.; Cui, X.; Petrone, N.; Lee, C. H.; et al., Flexible and Transparent MoS2 Field-Effect Transistors on Hexagonal Boron Nitride-Graphene Heterostructures, *ACS Nano* 2013, 7, 7931-7936.

Lei S. et al., Ternary CuIn7Se11 : towards ultra-thin layered photodetectors and photovoltaic devices. Adv Mater. Dec. 3, 2014;26(45):7666-72.

Lopez-Sanchez, O.; Lembke, D.; Kayci, M.; Radenovic, A.; Kis, A., Ultrasensitive photodetectors based on monolayer MoS2, *Nature Nanotech.* 2013, 8, 497-501.

Liu, F.; Shimotani, H.; Shang, H.; Kanagasekaran, T.; Zolyomi, V.; et al., High-sensitivity photodetectors based on multilayer GaTe flakes, *ACS Nano* 2014, 8, 752-760.

Gendreau, K. C.; Prigozhin, G. Y.; Huang, R. K.; Bautz, M. W., A technique to measure trap characteristics in CCD's using X-rays, *IEEE Transactions on Electron Devices* 1995, 42, 1912-1917.

Mudd, G. W.; Svatek, S. A.; Ren, T.; Patane, A.; Makarovsky, O.; et al., Tuning the Bandgap of Exfoliated InSe Nanosheets by Quantum Confinement, *Adv. Mater.* 2013, 25, 5714-5718.

Yoon, Y.; Ganapathi, K.; Salahuddin, S., How Good Can Monolayer MoS2 Transistors Be?, *Nano Lett.* 2011, 11, 3768-3773.

\* cited by examiner

CHARGE COUPLED DEVICE BASED ON ATOMICALLY LAYERED VAN DER WAALS SOLID STATE FILM FOR OPTO-ELECTRONIC MEMORY AND IMAGE CAPTURE

STATEMENT REGARDING FEDERALLY SPONSORED RESEARCH

This invention was made with government support under Grant No. W911NF-11-1-0362 from the U.S. Department of Defense and Grant No. N00014-10-1-0989 from the Office of Naval Research. The government has certain rights in the invention.

FIELD OF THE INVENTION

This invention relates to opto-electronic sensors. More particularly, to opto-electronic sensors with an atomically layered van der Waals film.

BACKGROUND OF INVENTION

The flexible, ultra-thin, and transparent electronics of the future places new dimensional, functional and performance demands on materials properties. Current semiconductor fabrication strategies based on bulk semiconductor materials encounter severe challenges in meeting such goals. The discovery of graphene, followed by the rise of other two dimensional (2D) materials in the past decade, has not only extended scientific understanding of atomically layered structures, but has also enabled a straightforward path to future unconventional electronics. This has led to the realization of atomically layered field effect transistors (FET), photodetectors, photovoltaics, nonvolatile memories, opto-electronic memory for gate tunable photodetector, and optical switcher which were further integrated with polymeric substrates to demonstrate prototypes of flexible electronics. However, an optoelectronic memory for image sensing, an essential part in modern electronic devices, that utilizes 2D atomic layered materials has not been demonstrated.

Image sensing places special requirement on optoelectronic sensors. It should reflect exposure dose instead of exposure intensity. The output of sensor should be history-dependent to realize complicated image processing functions, such as image integral, weak signal accumulation, etc. Ordinary photodetector cannot fulfill these requirements, whereas optoelectronic memories, such as charge-coupled device (CCD) and complementary metal-oxide-semiconductor (CMOS) device, are commonly utilized and play essential roles in image capture, spectrum analysis, bio-sensing, etc. These optoelectronic memories can accumulate the photogenerated charge carries during exposure, and release the stored charge for information retrieval.

A 2D atomically layered material based optoelectronic memory can broaden the realm of optoelectronic memories, and it can be easily integrated with other 2D material based devices, such as FET and nonvolatile memories, as well as provides the possibility for construction of a large-scaled, whole 2D material based, complicated functional unit.

SUMMARY OF INVENTION

In one embodiment, an opto-electronic sensor utilizing atomically layered materials is provided. The sensor may include a gate electrode layer, a dielectric layer in contact with the gate electrode layer, a working media layer that is photo-sensitive deposited on the dielectric layer, wherein the working media layer provides one or more layers of one or more materials where each of the one or more layers is an atomic layer. Further, the sensor may include side electrodes in contact with the working media layer that serve as a source and drain.

In another embodiment, a method for fabricating an opto-electronic sensor utilizing atomically layered materials is provided. The method include the steps of depositing a dielectric layer on a substrate, and forming one or more layers of materials where each of the one or more layers is an atomic layer, thereby forming a working media layer that is photo-sensitive. In some embodiments, the method may include forming the working media layer directly on the substrate or transferring the working media layer to the substrate. The method may also include patterning electrodes on the working media layer. In some embodiments, the substrate may serve as the gate electrode. In other embodiments, a gate electrode may be patterned on the substrate.

In some embodiments, the optoelectronic sensor may include multiple individual pixel units to form an array or matrix. The working media layer may form Schottky barrier(s) or pn junction(s) with the electrodes. In some embodiments, the working media layer may be a Cu—In—Ga—Se (CIS) system, III-IV semiconductors, Mo—W—S—Se system, InSe, $MoS_2$, $MoSe_2$, $MoTe_2$, $WS_2$, $WSe_2$, $WTe_2$, $TaS_2$, $TaSe_2$, $TiS_2$, $TiSe_2$, $NbS_2$, $NbSe_2$, $VS_2$, GaSe, InS, GaS, GaTe, Cu—In—Se system, $Cu_2S$, $Cu_2Se$, $SnS_2$, SnSe2, or the like.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
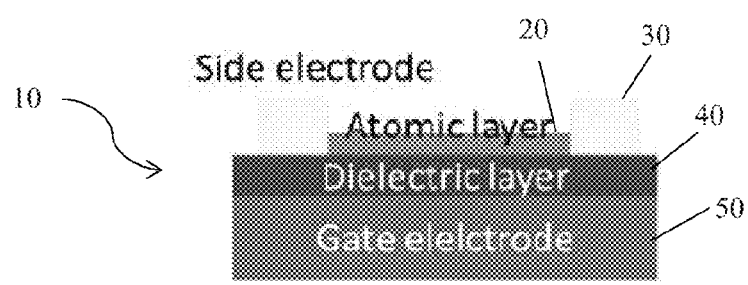
FIG. 1 is an illustrative embodiment of a single photo-sensing and storage unit (or a pixel)

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

An opto-electronic memory and image capture system and method are discussed herein. The system may be based on novel ultra-thin photo-sensitive materials formed as an atomically layered film. An atomically layered film may be deposited utilizing a controlled layer-by-layer process that results in the deposition of individual layers of one or more materials, wherein each individual layer is deposited one atomic layer at a time. Each of the individual layers may be atomically thin, as such the atomically layered film may be referred to as a 2D material. Additionally, atomically layered materials or 2D materials also refers to a group of materials that have a mica-like layered structure. Each layer has a thickness of atomic level, i.e. from sub-nanometer to sub-micrometer. The interaction between the layers is usually weak and composed by non-valence chemical bonds, typically, van der Waals interaction. This weak interaction makes the material very easy to be cleavage along a special orientation. Nonlimiting examples of atomically layered materials may include Cu—In—Ga—Se (CIS) system, III-IV semiconductors, Mo—W—S—Se system, $MoS_2$, $MoSe_2$, $MoTe_2$, $WS_2$, $WSe_2$, $WTe_2$, $TaS_2$, $TaSe_2$, $TiS_2$, $TiSe_2$, $NbS_2$, $NbSe_2$, $VS_2$, InSe, GaSe, InS, GaS, GaTe, Cu—In—Se system, $Cu_2S$, $Cu_2Se$, $SnS_2$, $SnSe_2$, or the like. As a nonlimiting example, the atomically layered film may be deposited utilizing atomic layer deposition (ALD), chemical vapor deposition (CVD), molecular beam epitaxy (MBE), physical vapor deposition (PVD), electron beam evaporation (e-beam evap), or any other suitable deposition method. In some embodiments, the atomically layered film may be a van der Waals solid state film(s) with a total thickness from nanometers to micrometers. In some embodiments, the atomically layered film may have an atom-level flat cleavage surface. In some embodiments, the atomically layered film may be a nanometer-scale film in terms of thickness. In some embodiments, the atomically layered film may have a thickness of 20 nm or less. In some embodiments, the atomically layered film may have a thickness of 10 nm or less. In some embodiments, the opto-electronic memory and image capture system may be utilized in a charge coupled device (CCD). In comparison to bulky solid state (Si, GaAs) CCD devices, these materials have several advantages, such as low weight, flexibility, transparence, and integration with thin-film electronics.

In modern portable electronics, especially personal mobile devices, image capture and storage units are playing important roles. Silicon-based CCD and complementary metal oxidesemiconductor (CMOS) devices are widely used as image capture units, which are rigid and hard to integrate with flexible thin film electronics, especially the electronics made of atomically layered film. The films discussed herein provide a flexible and ultra-thin CCD architecture based on atomically layered films with photo-sensitivity, such as a Cu—In—Ga—Se (CIS) system, III-IV semiconductors, Mo—W—S—Se system, InSe, $MoS_2$, $MoSe_2$, $MoTe_2$, $WS_2$, $WSe_2$, $WTe_2$, $TaS_2$, $TaSe_2$, $TiS_2$, $TiSe_2$, $NbS_2$, $NbSe_2$, $VS_2$, GaSe, InS, GaS, GaTe, Cu—In—Se system, $Cu_2S$, $Cu_2Se$, $SnS_2$, $SnSe_2$, or the like. Additionally, the atomically layered film may form a Schottky barrier or pn junction with a metal, an alloy, p-type or n-type material, or the like. The atomically layered film and junction material may be formed on top a dielectric layer, which may be formed from any suitable dielectric material. Further, a gate electrode may be provided below the dielectric layer. The gate electrode may be formed from a metal, alloy, p-type or n-type material, or any other suitable electrode material.

The atomically layered CCD (ALCCD) is composed of a matrix of single photo-sensing and storage units (or single pixels comprising an image capture matrix), which has a schematic shown in FIG. 1. A single pixel 10 is composed with four parts: working media (or atomically layered film) 20, side electrodes 30 with Schottky contact (or pn junction), dielectric layer 40 and gate electrode 50. As shown, dielectric layer 40 is deposited on top of a substrate, which may also serve as a gate electrode 50 in some embodiments. Atomic layer 20 is deposited on top of dielectric layer 40 in between two side electrodes 30. While this embodiment discusses a single photo-sensing and storage unit or single pixel, other embodiments may provide a matrix or array comprising multiple units or pixels.

Figures 2A, 2B, 2C:
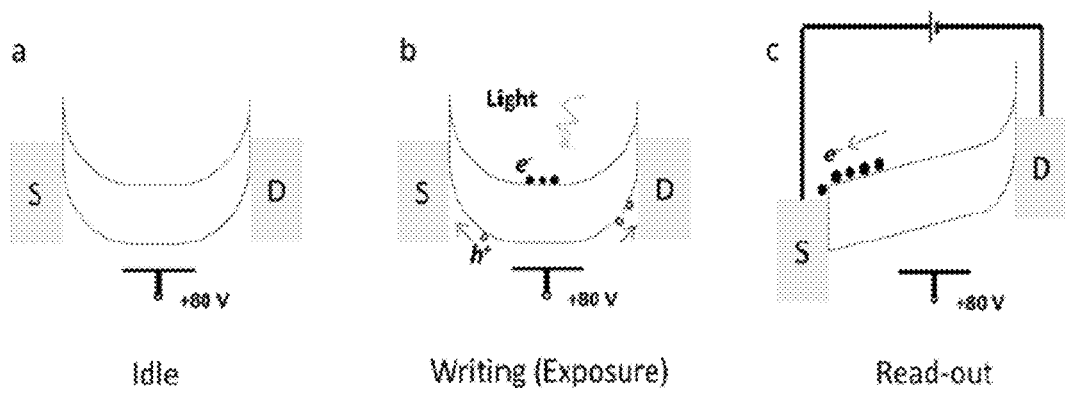
FIGS. 2A-2C show a general operation principle of an ALCCD, particularly in an idle, writing, and readout state.

FIGS. 2A-2C show a general operation principle of ALCCD. FIG. 2A show an ALCCD is in idle state. A gate voltage may be applied to the device to form a potential well for charge trapping. Because the Schottky barrier between the working media and electrodes, the charge injected from the electrodes is limited to a low level so that the potential well is relatively empty. In this state, no information is stored in the device and the device is ready for writing. As shown in FIG. 2B, the ALCCD may be written by light (or exposure), whereas in the dark, the potential well remains relatively empty. During this process, the light generates electron-hole pairs in the working material. Due to the potential well, one kind of charge carriers (while in this demonstration the charge carriers are illustrated as electrons, electrons or holes are possible) is trapped in the potential well, while the other kinds of charge carriers escape through the electrodes. The trapped charge is proportional to the light or exposure dose (or exposure time) so that the information conveyed by light can be store in the potential well for read-out, data processing, transferring to other permanent memories, and/or the like. As shown in FIG. 2C, a bias voltage may be applied to the device to overcome the potential well to realize the trapped charge and restore the information. In some embodiments, the trapping lifetime for the unit may be 50 seconds or greater. In some embodiments, the trapping lifetime for the unit may be 10 seconds or greater. In some embodiments, the trapping lifetime for the unit may be 5 seconds or greater. In some embodiments, the trapping lifetime for the unit may be 1 seconds or greater. In some embodiments, the trapping lifetime for the unit may be 500 ms or greater. In some embodiments, the trapping lifetime for the unit may be 100 ms or greater.

The design discussed above relies on Schottky barrier between metallic electrodes and the working media of van der Waals layered material to avoid leakage and dark current. In another embodiment, the atomically layered CCD can also work in following way. A constant bias voltage may always be applied to the device. Before image capturing, a gate voltage is applied to form potential well for charge trapping. After exposure, the gate voltage is removed so the potential well disappears and charge is release to restore the information. In yet another embodiment, a PN junction can also be applied to serve the same function as the Schottky barrier and may also operate in a similar manner. In such embodiments, the source and drain electrodes from the abovementioned embodiment shown in FIG. 1 may be formed with a doped material that has is the opposite the doping of the working media.

Figure 3:
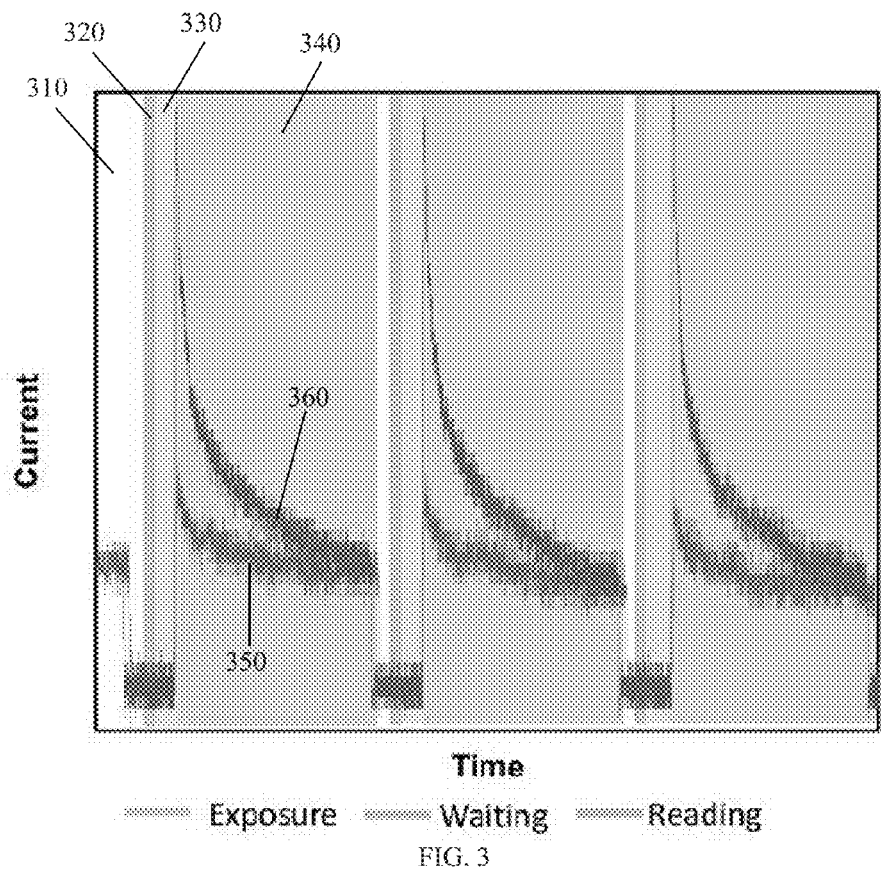
FIG. 3 shows an operating sequence for a photo-sensing and storage unit.

FIG. 3 shows the timing chart and performance the device. The operation sequence discussed above is labeled by zone in this timing chart. White zone 310 represents the idle state. Yellow zone 320 represents the writing (exposure) process. Pink zone 330 is the waiting time before the data stored being read out and the light blue zone 340 is the reading process. Multiple repetitions of this sequence are illustrated in the timing chart. The grey curve 350 shows the read-out current without writing (exposure), and dark blue curve 360 shows the read-out curve with writing (exposure). The signal-to-noise ratio is strong enough for data read-out.

This ALCCD can be used as an ultra-thin flexible image capture unit in portable, flexible electronics for personal entertainment, communication, etc. It can also be applied in the scenario that a transparent image capturing unit is critical. Traditional CCDs are thick and rigid so flexible and ultra-thin electronics with image capturing abilities cannot be fabricated with them. This ALCCD applies atomically layered films as a working media, and presents a CCD architecture based on atomically layered films. These atomically layered films may be made of one to several layers of van der Waals crystal(s). Unlike traditional thin film materials, the surface of atomically layered film is ultra-flat (in atomic level), and the in-plane interaction is strong so that it can bend without being broken.

Image capture units, such as in portable electronics or scientific instruments, are commonly solid state CCD or CMOS fabricated with rigid semiconductors, such as silicon, GaAs, or the like. As a result, the image capture units are rigid, thick, fragile and/or opaque. Though widely used, they can hardly meet the demands of future electronics and instruments. The ALCCD provides at least the following benefits:

Flexibility and Small Thickness: Thin film flexible devices are one of the major trends of future electronic market, especially personal portable electronics for communication and entertainment. Nowadays, various thin film flexible electronic units has been developed, such as organic based lighting source (OLED), thin film solar cell, thin film field effect transistor, etc. However, without a flexible thin film image capture unit, it is difficult, if not impossible, to make the entire device flexible. The ALCCD provides a possible solution for this issue. Further, the ALCCD is suitable for installation on a surface with curvature.

Light weight: The working media of ALCCD is a single-layered or few-layered van der Waals solid state film. This thin film is composed with several atomic layers, and the thinness of each layer is about 1 nm, so that the total thickness of the film is usually only tens of nanometers. In this case, the weight of the working media is negligible.

Transparency: The other benefit of this invention is that the ALCCD is transparent. The working media usually has an absorption rate of ~10%, so most light can pass through the ALCCD. As a result, it is possible to make transparent and even invisible image capture unit.

As a nonlimiting example, a method for forming an ALCCD may comprise the following steps: (1) Form a van der Waals atomic layer of material; (2) If necessary, transferring the van der Waals atomic layered material to a proper substrate (in some embodiments, the van der Waals atomic layer of material may have been formed on the substrate, thereby obviating the need to transfer the layer); (3) Pattern electrodes on or adjacent to the van der Waals atomic layered material; (4) Dielectric layered deposition; (5) Pattern gate electrodes on Dielectric layers; and (6) Cut continuous van der Waals atomic layered with electrodes into individual and separated pixel unit. It will be recognized by one of ordinary skill in the art that the steps for the method above may be performed in any suitable order and are not limited to being performed in the order listed above.

EXPERIMENTAL EXAMPLE

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

An atomically thin optoelectronic memory array for image sensing is demonstrated with layered $CuIn_7Se_{11}$, and the concept is further extended to InSe and $MoS_2$ atomic layers in other demonstrations. Photogenerated charge carriers are trapped and subsequently retrieved from the potential well formed by gating a 2D material with Schottky barriers. The atomically thin layered optoelectronic memory can accumulate photon-generated charges during light exposure, and the charges can be read out later for data processing and permanent storage. An array of atomically thin image memory pixels was built to illustrate the potential of fabricating large-scale 2D material-based image sensors for image capture and storage.

The fundamental physical principles of 2D material based, atomically thin-layered image sensors, which function similarly to conventional image sensors such as CCD, are discussed herein. A state-of-the-art device with an array of the image capture pixels was fabricated to demonstrate the possibility of fabricating a large-scale integrated image capture matrix based on these types of materials.

One key concept the design discussed herein is forming potential wells in atomically thin 2D semiconductor materials. By photo-excitation, electron-hole pairs can be generated, where one type of charge carrier is trapped by the potential well while the other type escapes. By subsequently releasing the trapped charge carriers, the information stored during photo-excitation can be retrieved. As a nonlimiting example, few-layered $CuIn_7Se_{11}$ (CIS) was chosen as the working medium to fabricate a test structure. CIS is a 2D material with a strong photoresponse, a sufficiently narrow 1.1 eV bandgap with a high external quantum efficiency when serving as a photodetector, all of which make it a very suitable candidate as the working medium in an image capture device with a visible light response. The basic principle, as well as the fabrication process, of the 2D image sensor discussed herein is not limited to CIS, but can be applied quite broadly to atomically thin layered materials, offering a wide range of choices in spectral response, storage lifetime, sensitivity, and other material-dependent properties, for the device.

Figure 4A:
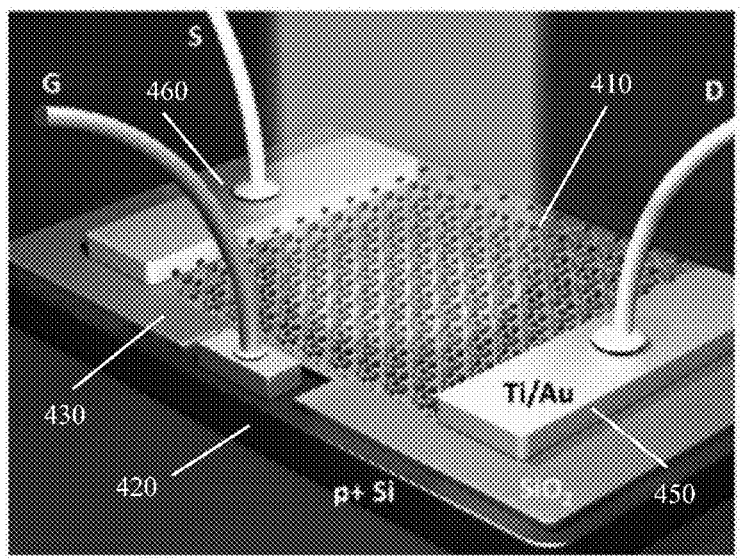
FIGS. 4A-4B show a schematic of a CIS-based test structure and an optical image of the CIS test structure.
Figure 4B:
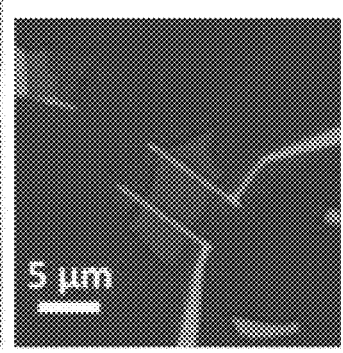

FIG. 4A shows the schematic of the few-layered CIS test structure. Atomically layered CIS 410 was mechanically exfoliated from the bulk crystal, which had been synthesized by solid state reaction with $In_2Se_3$ and $Cu_2Se$ as precursors. The exfoliated samples were transferred to p+ silicon substrates 420 capped with a 285 nm thermal oxide dielectric $SiO_2$ layer 430 and a p+ silicon substrate gate electrode 440 (note that the p+ silicon substrate 420 serves as the gate). Drain and source electrodes 450, 460 were then fabricated on top of the atomic layers by e-beam lithography with a spacing of 4 μm. 2 nm Ti and 38 nm Au were deposited onto the substrate by e-beam evaporation, followed by a lift-off process. As nonlimiting example, FIG. 4B shows an optical image of the CIS test structure fabricated with ~4 layered CIS or an atomically layered CCD prototype (3 pixels, and CIS serve as working media here). The width of both electrodes is 500 nm and the interelectrode spacing is 4 μm. A 543 nm laser with an intensity of 150 mW/cm$^2$ and a spot size of 500 μm was used as the illumination source for exposure. In this device, the Ti/Au (5 nm titanium and 35 nm gold) serves as side-electrodes, since the Ti/Au can form large Schottky junctions with the CIS. The Schottky junctions can keep the leakage current in the device at a very low level (1~10 pA) to improve the signal-to-noise ratio. However, the electrodes material is not limited to Ti/Au. Other material that can form Schottky junction with working media may also be utilized.

The operation sequence of the CIS test structure is shown in FIG. 3, and the band diagrams illustrating device charging and readout are shown in FIGS. 2A-2C. Since CIS itself is an n-type semiconductor, a +80 V gate voltage is applied to CIS to form the potential well between the two electrodes to trap electrons. Under dark conditions, the Schottky barriers between the CIS and the Ti/Au electrodes prevent electrons from being injected from the electrodes into the CIS, so that the potential well is kept empty (FIG. 2A). During the exposure process, a laser pulse illuminates the gated test structure (FIG. 3, yellow regions 320). Due to the photon excitation, electron-hole pairs are generated in the CIS flake. Due to the potential gradient generated by Schottky and gate voltages, holes escape from both electrodes, whereas the electrons get trapped at the bottom of the potential well (FIG. 2B). Because of this spatial separation of electrons and holes, the electrons trapped in the well have a very long lifetime. Thus, the information delivered by the excitation light is accumulated and stored in each potential well where it awaits subsequent read-out. After laser exposure, the test structure was kept in the dark while the gate voltage was sustained, maintaining the trapped electrons. This period of time is termed the "waiting time," simulating the delay time for data storage, read-out and signal processing in a real image capture device (pink regions 330 in FIG. 3). After the waiting time, a 10 V read-out bias was applied to the test structure to compensate the potential gradient generated by the Schottky barriers and the gate voltage (light blue region 340), so that one electrode junction is forward biased. This reduced one side of the potential well and releases the trapped electrons (FIG. 2C). This corresponds to a retrieval of the stored information in the device. During read-out, one of the two Schottky junctions remains in reverse bias to help minimize leakage current. In FIG. 3, the dark blue curve 360 shows the read-out current from the test structure. In a control experiment, the same process was repeated without laser exposure (FIG. 3, gray curve 350). This read-out current for the non-illuminated case is much weaker than that observed for the test structure following laser illumination. By measuring the intensity of the read-out current, the exposure dose can be calculated.

There are several factors that can contribute to the read-out current and the signal-to-noise ratio (S/N). First, when a bias voltage is suddenly applied to the test structure, there is a charging current due to the device capacitance. Second, since the device configuration is similar to an FET, with a large gate voltage the device is essentially in a FET ON state and generates a leakage current. Third, even while the test structure is in the dark, electrons can still be generated by thermal excitation and quantum tunneling, and thus be trapped in the potential well. In the ALCCD design, the Schottky barrier plays an important role in minimizing the read-out current. As mentioned earlier, the reverse-biased Schottky barriers prevent electrons from being injected from the electrodes into the potential well under dark conditions, and also minimize leakage current during read-out. As a comparison, a similar device was fabricated using $MoS_2$ as the working material and Au as electrodes in order to lower the Schottky barrier height. In these devices, the leakage current was very large during the read-out process. As a result, the second and third factors that affect the read-out current are controlled by the properties of the Schottky barrier, while the first factor can only be improved by using an overall device design that minimizes the capacitance.

Because the exposure dose of the CIS-based memory device can be determined, the as-fabricated test structure could serve as a pixel in an image capture matrix. The principle of the test structure is similar to a CCD, which can also accumulate photon-generated electrons during exposure. The difference is that in a commercial CCD, the trapped electrons are released by decreasing the gate voltage, i.e., by decreasing the potential well depth. In the ALCCD test structure, however, a voltage bias is applied to release the electrons. Also, a CCD matrix is typically read out in series (e.g. pixel-by-pixel using a serial register), but the ALCCD design can work in parallel. In particular, the ALCCD design allows pixels to be read out in parallel directly from the electrodes. The other unique feature in the ALCCD design is the utilization of Schottky junctions, which also help minimize dark current, improving the S/N of the device.

Figures 5A, 5B, 5C, 5D:
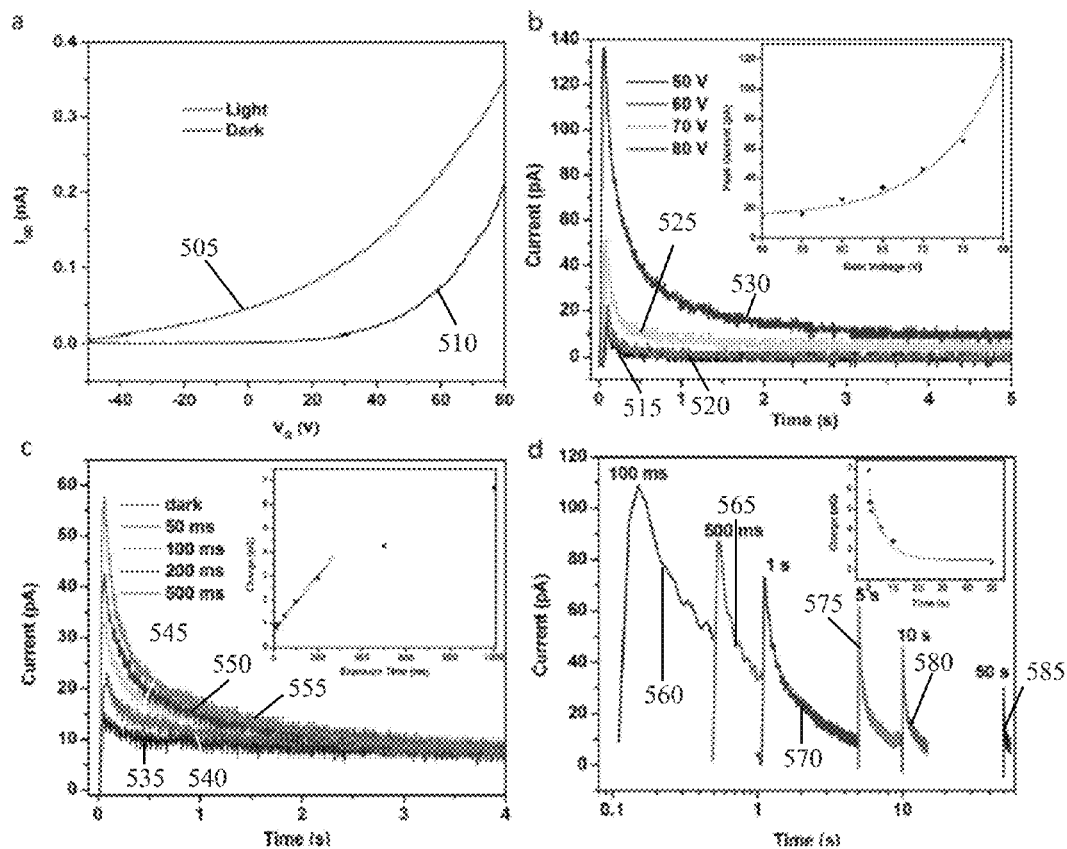
FIGS. 5A-5D show (a) source-drain current as a function of gate voltage for light and dark conditions for a CIS test structure, (b) read-out current for different gate voltages; (c) readout current as a function of exposure duration; and (d) charge storage lifetime or read-out current for different waiting times.

To further understand the processes of exposure and read-out, a systematic characterization of the device was performed (FIGS. 5A-5D). Since the device configuration is similar to a FET and the read-out current is strongly influenced by the field effect, transport measurements are of great importance. With a 1V bias, the source-drain current as a function of gate voltage is shown in FIG. 5A (with light 505 and dark 510). The test structure gradually turns on with an increasing positive gate voltage, indicating that the CIS is an n-type semiconductor. With a large gate voltage of +80 V, the dark current is about 20 pA, which is relatively small, resulting in a low read-out background.

Another widely studied effect in 2D material-based photodetectors, extremely large responsivities and external quantum efficiencies under large gate voltages (much larger than 100%) is also found in our device when it serves as a photodetector. As the gate voltage is increased, the difference between the photocurrent and the dark current, i.e., the photoresponsivity, also increases. This effect is mainly due to the long-lived trapped electrons induced by the large gate voltage. An electron can pass through the 2D material channel several times before it recombines with a hole, yielding a large responsivity. The responsivity is not a measure of the sensitivity of the active material of the device, since a large part of the measured current is due to the recycled electrons instead of the directly photo-excited electrons.

Since the gate voltage establishes the potential well that traps the electrons, the electron accumulation as a function of gate voltage is a very important parameter of the device. FIG. 5B shows the read-out current from the CIS-based test structure for a 10 V reading bias over a range of gate voltages (50V 515, 60V 520, 70V 525, and 80V 530). The read-out current is negative: the absolute value of the read-out current was plotted for convenience. The inset shows the relationship between the read-out current peak values (leakage current has been subtracted to remove the influence of the FET ON state) and gate voltages. It is obvious that the peak read-out current increases significantly with increasing gate voltage. From the inset in FIG. 5B, the peak current value and the gate voltage follows a simple exponential relationship, as illustrated by the red fitting curve. However, a very large gate voltage is not recommended, since the dark current would also increase during the read-out process. From the experimental test structure, it was found that 80 V was a nonlimiting optimal working gate voltage. For lower gate voltages, the read-out current is not large enough (this is the regime where the potential well is shallow and cannot trap enough electrons). When the gate voltage is larger than 80 V, the read-out background current increases significantly. In both voltage ranges, the read-out signal to background ratio suffered.

For many applications, as with CCDs, linear response is very important: the number of trapped electrons should be proportional to the exposure dose so that the image sensor can accurately regenerate the contrast of the original image. To characterize the linearity of the as fabricated device, the exposure time was varied (dark 535, 50 ms 540, 100 ms 545, 200 ms 550, and 500 ms 555) and the read-out currents were measured accordingly (FIG. 5C). As the exposure duration increase, the read-out current intensity increased. The read-out current was integrated over 100 ms, then the integrated dark current was subtracted, to obtain the number of photoelectrons. The integration time window was begun as soon as the read-out bias was applied to the device. The measurement was performed in this manner because it is the quantity of charge, rather than the current, that directly correlates to the exposure dose. In commercial image capture devices, the information stored in a sensor is retrieved by measuring the charge quantity instead of measuring the read-out current. The relationship between charge quantity and exposure dose is shown in the inset of FIG. 5C. It was found that the test structure maintained a linear response for exposure doses up to 200 ms (×150 mW/cm²). When the dose was increased further, the test structure response saturated.

Quantum efficiency is another important parameter for device evaluation. The quantum efficiency or sensitivity should be calculated in the linear response region. For this measurement a 200 ms exposure time was selected and a 5 sec integral was used instead of the previous 100 ms integral, since all the trapped photoelectrons needed to be counted. The integral of the read-out current eda total charge of 22.4 pC and the integral of the read-out background gave a total charge of 6.0 pC. Thus the effective photogenerated charge was 16.4 pC, i.e. $1.0 \times 10^8$ electrons. The area of the pixel was 16 μm². With a 200 ms exposure time, the total exposure dose was $1.1 \times 10^{10}$ photons and the quantum efficiency of the device was calculated to be 1%.

Another important parameter for an image capture device is the trapping (or de-trapping) lifetime. In most commercial applications, the optoelectronic image sensor, such as CCD and CMOS, provides only temporary image storage in a time window long enough for data read-out, processing and transferring, so the image can eventually be stored in non-volatile memories. As a result, it is not necessary to pursue extremely long trapping lifetimes in optoelectronic image capture units. However, a longer lifetime can be convenient, reducing the burden on the hardware for fast data processing and transfer. More importantly, a longer lifetime indicates a slower electron dissipation rate, which leads to a higher sensitivity and quantum efficiency. To determine the trapping lifetime in the CIS test structure, the device was illuminated with a light pulse with a one second duration to saturate the device and change the waiting time. FIG. 5D shows the read-out current curve as a function of waiting time (100 ms 560, 500 ms 565, 1 s 570, 5 s 575, 10 s 580, and 50 s 585). To illustrate the trapping performance in a large timescale, the x-axis is plotted on a logarithmic scale. After exposure of 1 sec, the test structure was kept under dark conditions for different waiting times to characterize the decay of the trapped photoelectrons. As the waiting time is increased, the read-out current and the integrated read-out current decay. Using the same 200 ms integral described earlier in the dose-dependence discussion, the charge quantity reading as a function of waiting time is plotted in the inset of FIG. 5D. This quantity shows an obvious exponential behavior with a waiting time. The read-out integral decays exponentially as a function of the waiting time.

There are two major factors that limit the trapping lifetime. One is leakage through the gate electrode. In our case, it is the leakage from the CIS to the silicon substrate through the SiO₂ layer. This process is basically a quantum tunneling process, so the rate of electron dissipation can be expressed as $$\frac{dn}{dt} = -\frac{n}{\tau_Q}, \qquad (1)$$

where n is the density of trapped electrons and $\tau_Q$ is the time constant of the leakage process.

The other factor is the electrons de-trapping through both electrodes by thermal fluctuations, and can be expressed as $$\frac{dn}{dt} = -\frac{n}{\tau_T}, \qquad (2)$$

where $\tau_T$ is the time constant corresponding to thermal de-trapping. Combining with equation (1), the rate equation for the de-trapping process is $$\frac{dn}{dt} = -\left(\frac{1}{\tau_Q} + \frac{1}{\tau_T}\right)n = -\frac{n}{\tau}, \qquad (3)$$

and $n=n_0 e^{-t/\tau}$, or $Q=Q_0 x e^{-t/\tau}$, where Q is the quantity of charge.

Since the device was tested under a vacuum of $\sim 10^{-6}$ ton, the number of electrons escaping through the residual gases in the measurement chamber could be ignored. By fitting the data shown in the inset, the time constant is about 5.9 sec. However, it should be noted that this time constant only gives the time until which the signal decays to 1/e of the original value. The information can still be recovered even 50 s after light exposure, since the signal level is still about 2 times larger than the read-out background.

Figures 6A, 6B:
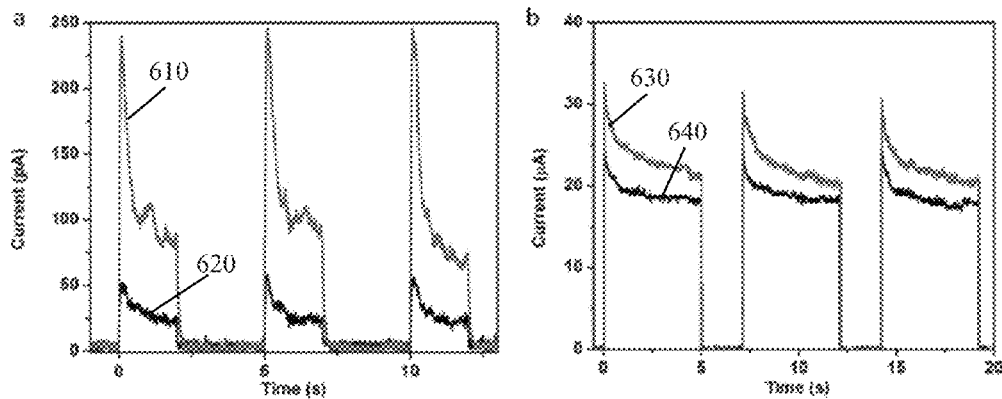
FIGS. 6A-6B show read out currents with and without exposure for a InSe-based test structure and a $MoS_2$ test structure.

Generally, the CIS-based atomically thin optoelectronic image-capture device demonstrated here shows excellent properties and can serve as a single pixel in next generation of ultrathin image capture and storage device. In order to prove the versatility of the working principle of this device, the techniques discussed herein were applied to other 2D materials, as well to the requirements of different applications, such as various spectral response ranges, sensitivity and flexibility. As an example, atomically layered InSe as active material was used to show the versatility of this approach. The reason for choosing InSe is that it has a very good photoresponse, and can form a Schottky barrier with Ti/Au electrodes. InSe is an n-type semiconductor with a band gap similar to CIS (1.4 eV). The few-layered InSe flake was prepared by mechanical exfoliation of the bulk crystal. The InSe-based test structure was fabricated with the same procedure and configuration as the CIS test structure. FIG. 6a shows the read-out currents from the InSe test structure with 610 and without exposure 620. The read-out bias is −10 V and gate voltage is +90 V. The read-out currents have similar features to those of the CIS device, so the same operating principle seems to apply to InSe layers as well. However, due to the weaker photoreponsivity of layered InSe and the shorter electron storage time of 0.9 s, the InSe device shows a lower quantum efficiency. To further demonstrate the versatility of this device principle and the role that the Schottky barriers play in the device response and performance, a single-layered CVD $MoS_2$-based pixel was fabricated and studied. The read-out currents for this test structure with 630 and without exposure 640 are shown in FIG. 6b, where the read-out bias was −10 V and the gate voltage was +80V. Since the Ti/Au electrodes cannot form good Schottky barriers on $MoS_2$, the trapping is very ineffective and a large leakage current passes through the device during read-out. Although the $MoS_2$ test structure did not show as good performance as the CIS-based device, it still clearly demonstrates the versatility of the device principle.

Figures 7A, 7B, 7C:
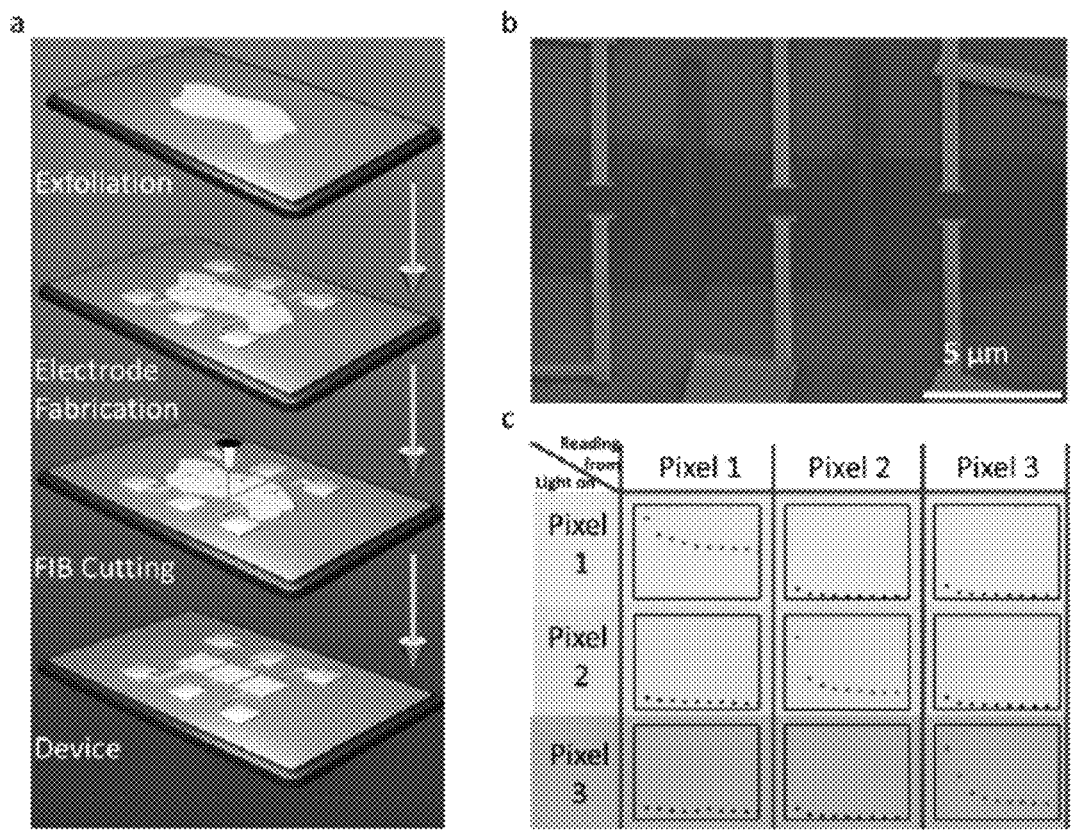
FIGS. 7A-7C show (a) a fabrication process for a CIS-based memory array, (2) SEM image of a layered CIS-based accumulator array; and (c) performance of each pixel in the array.

Thus far, discussion of the working principle has focused on a single pixel in the image capture matrix realized using various atomic-layer 2D materials. Now the feasibility of fabricating a large-scale integrated 2D optoelectronic memory matrix is examined, which can serve as a fully functional image capture matrix. FIG. 7a shows the fabrication process of a memory array comprising three units. First, a large-scale CIS was chosen to flake on a $SiO_2$/Si surface (e.g. a few-layer CIS on a 285 nm silicon substrate with large scale was selected as the precursor). Three sets of electrode pairs were then patterned onto the CIS using e-beam lithography, followed by e-beam evaporation and metal deposition. Following lift-off, the flake was cut by focused ion beam (FIB) along the central lines separating the electrode pairs, so that three separate working devices were created. After FIB, the sensor array is completed as shown. An SEM image of the as-fabricated memory array is shown in FIG. 7b. In FIG. 7c, the working performance of the pixel array is demonstrated. A 514 nm wavelength laser with a spot size of ~1 μm is focused on each individual pixel, leaving the other pixels unexposed. On the top row of FIG. 7c, Pixel 1 has a strong read-out current when illuminated, whereas Pixels 2 and 3 yield only the read-out background current. When Pixel 2 is illuminated, as seen in the middle row of FIG. 7c, only Pixel 2 produces a read-out current. In the bottom row, the same result is seen for Pixel 3 when exclusively illuminated. This experiment shows that the array has the ability to distinguish the spatial position of the laser focus. If a larger matrix with a greater number of elements is fabricated it would have the ability to capture a more complex spatial distribution of incident light, i.e., an image.

In summary, a 2D material-based photo-electron image sensor was demonstrated which can ultimately be integrated with a 2D electronics platform. The charge carrier traps that store illumination information are formed by gating the 2D material with Schottky barriers on both sides of the structure. Under illumination, photogenerated electrons are trapped in the 2D material. By applying a read-out bias voltage large enough to compensate for the trap and Schottky barrier, the trapped charges can be released and the information stored can be retrieved. By duplicating the fundamental memory units, it was also shown that a memory array can be fabricated in which each unit could work independently. This work demonstrates, for the first time, the possibility of a large-scale 2D material-based optoelectronic memory matrix which can serve as an image capture and storage unit in a new generation of portable, flexible and ultra-thin electronic devices.

Methods

Characterization of single pixel device: The CIS, InSe and $MoS_2$ single pixel image sensors were characterized on a home-built probe station with a 1-inch fused silica optical window for sample illumination and a vacuum capability of 10-5 torr. A 543 nm wavelength He/Ne laser was focused and injected into an acoustic optical modulator (AOM) for laser intensity stabilization, control, and modulation (for light pulse generation). The turn-on and turn-off time of the AOM was optimized to be less than 1 μs. After passing through AOM, laser was directed to the optical window and focused onto the sample placed inside the vacuum probe station. The devices were powered with a Keithley 2634B dual-channel source meter unit connected to the probe station with a triaxial cable for low-noise measurement. The read-out currents were amplified by a Standford Research Systems (SR570) low-noise current amplifier and recorded by a 10 MHz bandwidth Teletronix oscilloscope.

Characterization of the image sensor array: The array was tested using a microscope system which provided a 514 nm laser with a spot size of ~1 μm and an in situ image capability for pixel localization. The devices were powered and the read-out current was recorded by a Keithley 2634B dual-channel source meter unit.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. An opto-electronic sensor comprising:
an atomically layered charge coupled device (ALCCD) comprising a matrix of pixels, wherein each pixel comprises
   a gate electrode layer;
   a dielectric layer in contact with the gate electrode layer, wherein the dielectric layer is on top of the gate electrode layer;
   a working media layer that is photo-sensitive positioned on top of the dielectric layer, wherein the working media layer provides one or more layers of one or more materials where each of the one or more layers is an atomic layer; and
   side electrodes in contact with the working media layer.

2. The sensor of claim 1, wherein the working media layer is a van der Waals solid state film and where the interaction between the one or more layers are non-valence chemical bonds or van der Waal interactions.

3. The sensor of claim 1, wherein the working media layer forms a mica-like layered structure.

4. The sensor of claim 1, wherein the side electrodes and the working media layer form Schottky barriers.

5. The sensor of claim 1, wherein the side electrodes and the working media layer form a pn junction.

6. The sensor of claim 1, wherein the working media layer is selected from a Cu—In—Ga—Se (CIS) system, III-IV semiconductors, Mo—W—S—Se system, InSe, $MoS_2$, $MoSe_2$, $MoTe_2$, $WS_2$, $WSe_2$, $WTe_2$, $TaS_2$, $TaSe_2$, $TiS_2$, $TiSe_2$, $NbS_2$, $NbSe_2$, $VS_2$, GaSe, InS, GaS, GaTe, Cu—In—Se system, $Cu_2S$, $Cu_2Se$, $SnS_2$, or $SnSe_2$.

7. The sensor of claim 1, wherein the sensor is turned on by applying a voltage to the gate electrode layer, and a voltage bias is applied to the side electrodes to read-out.

8. The sensor of claim 1, wherein multiple sets of each of the components recited in claim 1 are provided to form an array of image capture and storage units.

9. The sensor of claim 1, wherein the array is read-out in parallel.

10. The sensor of claim 1, wherein the sensor is flexible, transparent, or both.

11. A method for fabricating an opto-electronic sensor, the method comprising:
forming at an atomically layered charge coupled device (ALCCD) comprising a matrix of pixels, wherein the method for fabricating the matrix of pixels comprises the steps of
   depositing a dielectric layer on top of a substrate;
   forming one or more layers of materials to create a working media layer that is photo-sensitive on top of the dielectric layer, wherein each of the one or more layers is an atomic layer; and
   patterning electrodes on the working media layer.

12. The method of claim 11 further comprising cutting the working media layer into individual pixel units to separate the working media for the individual pixel units, wherein each of the individual pixel units provides a pair of the electrodes on the working media layer.

13. The method of claim 11 further comprising patterning a gate electrode.

14. The method of claim 11, wherein the working media layer is a van der Waals solid state film and where the interaction between the one or more layers are non-valence chemical bonds or van der Waal interactions.

15. The method of claim 11, wherein the electrodes and the working media layer form Schottky barriers.

16. The method of claim 11, wherein the working media layer forms a mica-like layered structure.

17. The method of claim 11, wherein the working media layer is selected from a Cu—In—Ga—Se (CIS) system, III-IV semiconductors, Mo—W—S—Se system, InSe, $MoS_2$ $MoSe_2$, $MoTe_2$, $WS_2$, $WSe_2$, $WTe_2$, $TaS_2$, $TaSe_2$, $TiS_2$, $TiSe_2$, $NbS_2$, $NbSe_2$, $VS_2$, GaSe, InS, GaS, GaTe, Cu—In—Se system, $Cu_2S$, $Cu_2Se$, $SnS_2$, $SnSe_2$.

18. The method of claim 12, wherein an array comprising the individual pixel units is read-out in parallel.

19. The method of claim 11, further comprising transferring the working media layer to the substrate.

20. The method of claim 11, wherein the sensor is flexible, transparent, or both.

* * * * *